United States Patent
Kim et al.

(10) Patent No.: US 9,390,997 B2
(45) Date of Patent: Jul. 12, 2016

(54) SEMICONDUCTOR CHIP AND STACKED TYPE SEMICONDUCTOR PACKAGE HAVING THE SAME

(71) Applicants: SK hynix Inc., Icheon-si Gyeonggi-do (KR); Seoul National University R&DB Foundation, Seoul (KR)

(72) Inventors: Jong Hoon Kim, Suwon-si (KR); Jae Hyun Son, Gwangju-si (KR); Byoung Do Lee, Incheon (KR); Kuk Jin Chun, Seoul (KR); Woong Kyu Choi, Seoul (KR)

(73) Assignee: SK hynix, Inc., Icheaon-si, Gyeonggi-do (KR)

( * ) Notice: Subject to any disclaimer, the term of this patent is extended or adjusted under 35 U.S.C. 154(b) by 52 days.

(21) Appl. No.: 14/139,249

(22) Filed: Dec. 23, 2013

(65) Prior Publication Data

US 2015/0008588 A1 Jan. 8, 2015

(30) Foreign Application Priority Data

Jul. 5, 2013 (KR) .................. 10-2013-0078718

(51) Int. Cl.
*H01L 23/528* (2006.01)
*H01L 23/373* (2006.01)
(Continued)

(52) U.S. Cl.
CPC ........ *H01L 23/373* (2013.01); *H01L 23/49827* (2013.01); *H01L 23/49838* (2013.01); *H01L 25/0657* (2013.01); *H01L 23/3128* (2013.01); *H01L 23/3677* (2013.01); *H01L 23/3735* (2013.01); *H01L 23/49822* (2013.01); *H01L 23/50* (2013.01); *H01L 24/05* (2013.01); *H01L 24/06* (2013.01); *H01L 24/13* (2013.01); *H01L 24/16* (2013.01); *H01L 24/32* (2013.01); *H01L 24/73* (2013.01); *H01L 24/92* (2013.01); *H01L 2224/0401* (2013.01); *H01L 2224/056* (2013.01); *H01L 2224/0557* (2013.01); *H01L 2224/05568* (2013.01); *H01L 2224/05611* (2013.01); *H01L 2224/05647* (2013.01); *H01L 2224/05655* (2013.01); *H01L 2224/06136* (2013.01); *H01L 2224/06181* (2013.01);
(Continued)

(58) Field of Classification Search
CPC ............ H01L 23/373; H01L 23/49827; H01L 23/49838
See application file for complete search history.

(56) References Cited

U.S. PATENT DOCUMENTS

2012/0091587 A1* 4/2012 Or-Bach et al. ............... 257/741

FOREIGN PATENT DOCUMENTS

| KR | 100874910 B1 | 12/2008 |
| KR | 100984729 B1 | 9/2010 |
| KR | 1020120018713 A | 5/2012 |

*Primary Examiner* — Wael Fahmy
*Assistant Examiner* — Sarah Salerno
(74) *Attorney, Agent, or Firm* — William Park & Associates Ltd.

(57) ABSTRACT

The disclosure relates to a semiconductor chip and a stacked type semiconductor package having the same. The semiconductor chip includes: a semiconductor chip body having a first surface formed with a plurality of bonding pads and a second surface which is opposite to the first surface, a plurality of first and second through electrodes that pass through the semiconductor chip body and one ends thereof are electrically connected to the bonding pads, an insulating layer formed over the second surface of the semiconductor chip body such that the other ends of the first and second through electrodes are not covered by the insulating layer, and a first heat spreading layer formed over the insulating layer.

10 Claims, 13 Drawing Sheets

(51) Int. Cl.
   *H01L 25/065*   (2006.01)
   *H01L 23/367*   (2006.01)
   *H01L 23/498*   (2006.01)
   *H01L 23/50*   (2006.01)
   *H01L 23/31*   (2006.01)
   *H01L 23/00*   (2006.01)

(52) U.S. Cl.
   CPC .................... *H01L 2224/131* (2013.01); *H01L 2224/16146* (2013.01); *H01L 2224/16227* (2013.01); *H01L 2224/32145* (2013.01); *H01L 2224/32225* (2013.01); *H01L 2224/73204* (2013.01); *H01L 2224/73253* (2013.01); *H01L 2224/92125* (2013.01); *H01L 2225/06513* (2013.01); *H01L 2225/06517* (2013.01); *H01L 2225/06541* (2013.01); *H01L 2225/06544* (2013.01); *H01L 2225/06565* (2013.01); *H01L 2225/06589* (2013.01); *H01L 2924/15311* (2013.01)

SEMICONDUCTOR CHIP AND STACKED TYPE SEMICONDUCTOR PACKAGE HAVING THE SAME

CROSS-REFERENCES TO RELATED APPLICATIONS

The present application claims priority under U.S.C. 119 (a) to Korean patent application number 10-2013-0078718 filed on Jul. 5, 2013, in the Korean Intellectual Property Office, which is incorporated herein by reference in its entirety.

BACKGROUND

1. Technical Field

The disclosure relates to a semiconductor package, and more particularly, to a semiconductor chip capable of easily dissipating heat and a stacked type semiconductor package having the same.

2. Related Art

As electronic products become smaller and more functional, there is a need to include more chips in the smaller electronic products to satisfy required functions. As demand for semiconductor devices capable of realizing lower cost, higher performance, increased miniaturization and higher packaging density have increased, packages having multiple chips, e.g. multi-chip packages, have been developed to satisfy the demand.

A multi-chip package includes a plurality of semiconductor chips within a single semiconductor package. Through-substrate via (hereafter referred to as TSV) technology provides vertical electrical connections that extend the full thickness of the wafer from one of the electrically conductive levels formed on a topside semiconductor surface of the integrated circuit die (e.g., contact level or one of the back end of line metal interconnect levels) to the die's bottom side surface. The vertical electrical paths are significantly short as compared with electrical paths formed by conventional wire bonding technology.

SUMMARY

Various embodiments are generally directed to a semiconductor chip capable of easily dissipating heat and a stacked type semiconductor package having the same.

In an embodiment of the present invention, a semiconductor chip includes: a semiconductor chip body having a first surface formed with a plurality of bonding pads and a second surface which is opposite to the first surface, a plurality of first and second through electrodes that pass through the semiconductor chip body and one ends thereof are electrically connected to the bonding pads, an insulating layer formed over the second surface of the semiconductor chip body such that the other ends of the first and second through electrodes are not covered by the insulating layer, and a first heat spreading layer formed over the insulating layer.

In an embodiment of the present invention, a stacked type semiconductor package includes: a semiconductor chip including a semiconductor chip body having a first surface formed with a plurality of bonding pads and a second surface which is opposite to the first surface, a plurality of first and second through electrodes that pass through the semiconductor chip body and one ends thereof are electrically connected to the bonding pads, an insulating layer formed over the second surface of the semiconductor chip body such that the other ends of the first and second through electrodes are not covered by the insulating layer, and a first heat spreading layer formed over the insulating layer; at least one second semiconductor chip stacked over the first semiconductor chip and having substantially the same configuration as the first semiconductor chip; and connection members interposed between the first semiconductor chip and the second semiconductor chip, and between the stacked two or more second semiconductor chips.

DETAILED DESCRIPTION

Hereafter, various embodiments of the present disclosure will be described in detail with reference to the accompanying drawings.

Figure 1:
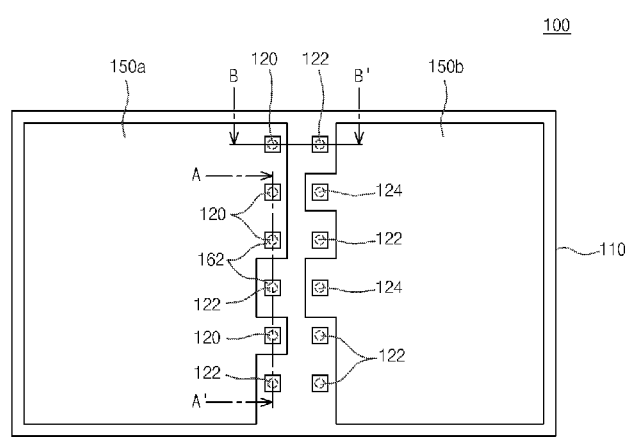
FIG. 1 is a plan view illustrating a semiconductor chip in accordance with an embodiment of the present disclosure.
Figure 2A:
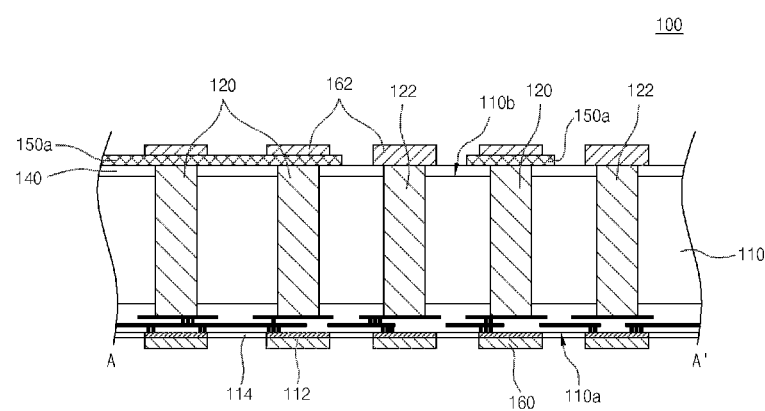
FIGS. 2A and 2B are cross-sectional views taken along a line A-A' of FIG. 1.

Referring to FIGS. 1 and 2A, a semiconductor chip 100 in accordance with an embodiment may include a semiconductor chip body 110, a plurality of first through electrodes 120, a plurality of second through electrodes 122, a plurality of third through electrodes 124, an insulating layer 140, and heat spreading layers 150a and 150b. The semiconductor chip 100 may further include a plurality of first connection electrodes 160 and a plurality of second connection electrodes 162.

The semiconductor chip body 110 includes a first surface 110a which is an active surface formed with semiconductor elements and a second surface 110b which is opposite to the first surface 110a. The second surface 110b may include a circuit unit (not shown) formed inside thereof. The circuit unit may include, for example, a data storage unit (not shown) for storing data and a data processing unit (not shown) for processing data. The semiconductor chip body 110 may further include a plurality of bonding pads 112, which are arranged over the first surface 110a of the semiconductor chip body 110 and electrically connected with the circuit unit. A passivation layer 114 may be formed over the first surface 110a such that the bonding pads 112 exposed.

The first, second and third through electrodes 120, 122 and 124 are formed inside the semiconductor chip body 110. The first, second and third through electrodes 120, 122 and 124 may be connection paths through which electrical signals are transmitted to and received from semiconductor elements. For example, the first through electrodes 120 may be power electrodes or ground electrodes. The third through electrodes 124 may be ground electrodes or power electrodes that have a potential that is different than the first through electrodes 120. The second through electrodes 122 may be signal electrodes. Alternatively, when the first through electrodes 120 are power electrodes, the second through electrodes 122 may be power electrodes that have a different potential form the first through electrodes 120. One end of each of the first, second and third through electrodes 120, 122 and 124 are electrically connected with the bonding pads 112 arranged over the first surface 110a of the semiconductor chip body 110 through the circuit unit. The numbers and arrangement positions of the first, second and third through electrodes 120, 122 and 124 may vary.

In the present embodiment, the other ends of the first, second and third through electrodes 120, 122 and 124 are arranged over the second surface 110b of the semiconductor chip body 110 and protrude from the second surface 110b. In an alternative example, however, as shown in FIG. 2B, the other ends of the first, second and third through electrodes 120, 122 and 124 may be formed such that the other ends of the first, second and third through electrodes 120, 122 and 124 do not protrude from the second surface 110b of the semiconductor chip body 110.

The first, second and third through electrodes 120, 122 and 124 may be formed, for example, by filling a conductive layer within via holes formed in the semiconductor chip body 110. The conductive layer may include any one of gold (Au), silver (Ag), copper (cu), aluminum (Al), Nickel (Ni), Chromium (Cr) and tungsten (W), preferably copper (Cu).

The insulating layer 140 is formed only over the second surface 110b of the semiconductor chip body 110 such that the insulating layer 140 does not cover the upper faces of the first, second and third through electrodes 120, 122 and 124 protruding from the second surface 110b of the semiconductor chip body 110. In some embodiments, the insulating layer 140 may be formed such that the insulating layer 140 partly, but not completely, covers the respective upper faces of the first, second and third through electrodes 120, 122 and 124. The insulating layer 140 may be formed of any one selected from a silicon oxide film, a silicon nitride film, a photosensitive film and a polymer film.

Figure 2B:
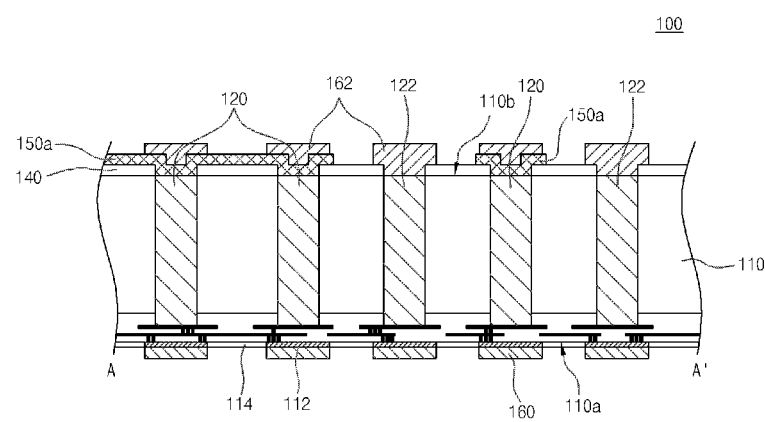

If, as shown in FIG. 2B, the other ends of the first, second and third through electrodes 120, 122 and 124 are formed such that they do not protrude from the second surface 110b of the semiconductor chip body 110, the insulating layer 140 may be subject to an etch process such that the other ends of the first, second and third through electrodes 120, 122 and 124 are exposed.

The heat spreading layers 150a and 150b may be formed as a thin film over the first through electrodes 120, the third through electrodes 124 and the insulating layer 140 such that the heat spreading layers 150a and 150b are in direct contact with the first through electrodes 120 and the third through electrodes 124. Also, in one embodiment, the heat spreading layers 150a and 150b are not in contact with the second through electrodes 122. In the present embodiment, the heat spreading layers 150a and 150b may include the first heat spreading layer 150a formed to cover the first through electrodes 120 that are power electrodes or ground electrodes, and the second heat spreading layer 150b formed to cover the third through electrodes 124 that are ground electrodes or power electrodes. The third through electrodes 124 may have a potential that is different from the potential of the first through electrodes 120. In particular, the heat spreading layers 150a and 150b in the present embodiment may be arranged over the entire area of the second surface 110b with the first and third through electrodes 120 and 124 being covered but the second through electrodes 122 not being covered.

The heat spreading layers 150a and 150b may be formed of a material having a high thermal conductivity, preferably graphene having a thermal conductivity of 500 to 5000 watts per meter kelvin (W/mK). In this case, the heat spreading layers 150a and 150b formed of the graphene may be formed with a thickness of 0.3 to 6 μm. The graphene is generally known as having a thermal conductivity that is two times higher than that of diamond and ten times higher than that of copper (Cu). For this reason, the heat spreading layers 150a and 150b formed of the graphene may not only effectively spread the heat generated from the semiconductor chip 100 without increasing total thickness of a semiconductor package but also rapidly dissipate heat to the outside of the first and third through electrodes 120 and 124. In an alternative embodiment, the heat spreading layers 150a and 150b may be formed of any of copper (Cu), gold (Au), silver (Ag) and nickel (Ni).

The first and second connection electrodes 160 and 162 may be formed such that the first and second connection electrodes 160 and 162 are connected to ends of the first and second through electrodes 120 and 122 arranged over the first surface 110a and the second surface 110b, respectively. Specifically, the first connection electrodes 160 are formed over respective bonding pads 112 which are electrically connected to the one ends of the first, second and third through electrodes 120, 122 and 124. The second connection electrodes 162 are formed over portions of the heat spreading layers 150a and 150b above the other ends of the first and third through electrodes 120 and 124 arranged over the second surface 110b, and formed over the other ends of the second through electrodes 122 that are not covered by the heat spreading layers 150a and 150b. The first and second connection electrodes 160 and 162 may be front bumps and rear bumps, respectively, and may be formed of any one of solder, nickel, copper, tin and alloy thereof.

With the semiconductor chip 100 in accordance with an embodiment, heat generated from hot spots during the semiconductor chip 100 operation is absorbed to the heat spreading layers 150a and 150b and thus is rapidly spread. Furthermore, since the heat spreading layers 150a and 150b are connected to the power and ground electrodes, i.e. the first and third through electrodes 120 and 124, heat generated during the semiconductor chip 100 operation is efficiently discharged to the outside through the first and third through electrodes 120 and 124. Therefore, the semiconductor chip 100 in accordance with an embodiment has an ultra-thin heat dissipating structure, which can effectively prevent poor operation due to the heat generated during its operation. Further, electric shorts between the second through electrodes 122 may be prevented because the heat spreading layers 150a and 150b are not electrically connected with the second through electrodes 122.

Furthermore, with the semiconductor chip 100 in accordance with an embodiment, it is sufficient to simply form the heat spreading surfaces 150a and 150b and thus there is no need to form further structures for heat dissipation. Furthermore, the first and third through electrodes 120 and 124, which are power electrodes and ground electrodes, can be utilized as the electrodes for the heat dissipation, i.e. thermal vias and thus there is no need to form further thermal vias, thereby alleviating the problem of increased chip size.

Consequently, the semiconductor chip 100 in accordance with an embodiment has a structure capable of easily dissipating heat without an increase in chip size. Chip size is controlled by selectively forming the heat spreading surfaces 150a and 150b.

Hereafter, process steps for manufacturing the semiconductor chip 100 in accordance with an embodiment as described above will be described with reference to FIGS. 3A to 3E.

Figure 3A:
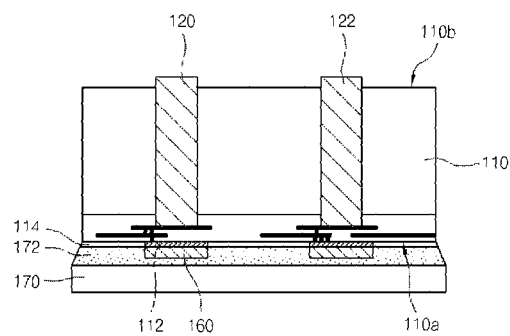
FIGS. 3A to 3E are cross-sectional views taken along a line B-B' of FIG. 1 and illustrating process steps for fabricating the semiconductor chip in accordance with an embodiment of the present disclosure.

Referring to FIG. 3A, there is provided a structure in which a circuit unit is formed inside of the semiconductor chip body 110 adjacent to the first surface 110a of the semiconductor chip body 110, the first through electrodes 120, the second through electrodes 122 and the third through electrodes (see, for example, FIG. 1) are formed within the semiconductor chip body 110 such that one ends thereof are connected to the circuit unit. A plurality of bonding pads 112 are formed over the first surface 110a such that the plurality of bonding pads 112 are connected to the circuit unit. The first connection electrode 160 is formed over respective bonding pads 112 and the first surface 110a of the semiconductor chip body 110. The first surface of the semiconductor chip body 110 may be formed with the first connection electrodes 160 attached to a carrier substrate 170 by an adhesive layer 172.

The semiconductor chip body 110 includes the first surface 110a and the second surface 110b opposite to the first surface 110a. The second surface 110b of the semiconductor chip body 110 may be removed by a predetermined thickness using a thinning process. The thinning process may be implemented by a back grinding.

The first through electrodes 120, the second through electrodes 122 and the third through electrodes may be formed, for example, in a shape of a pillar. The first through electrodes 120, the second through electrodes 122 and the third through electrodes may be formed using a conductive layer of at least one of gold (Au), silver (Ag), copper (Cu), aluminum (Al), nickel (Ni), chromium (Cr) and tungsten (W), and the conductive layer may be formed through at least one of electroplating, vacuum evaporation, sputtering, chemical vapor deposition or calcination after application of conductive paste. The first through electrodes 120 may be power electrodes or ground electrodes. The second through electrodes 122 may be signal electrodes. The third through electrodes may be ground electrodes or power electrodes that have a potential different from the first through electrodes 120.

The circuit unit may include, for example, a data storage unit for storing data and a data processing unit for processing data. The plurality of bonding pads 112 are arranged in two rows in a central portion of the first surface 110a of the semiconductor chip body 110. The passivation layer 114 may be formed over the first surface 110a such that the formed passivation layer 114 leaves the bonding pads 112 exposed. The first connection electrodes 160 may be front bumps and may be formed of any of solder, nickel, copper, tin and alloy thereof.

The carrier substrate 170 serves to support the wafer; a glass wafer supporting system may be used. As the adhesive layer 172, a material allowing easy attachment and detachment of the carrier substrate 170 may be used. For example, the adhesive layer 172 may be a film type or liquid type material that readily loses its adhesiveness by UV radiation or heating.

Subsequently, some thickness of the second surface 110b of the semiconductor chip 110 is removed through a recess process such that the other ends of the first through electrodes 120, the second through electrodes 122 and the third through electrodes protrude from the semiconductor body 110. The recess process on the semiconductor chip body 110 may be implemented using a Reactive Ion Etch (RIE), dry etch, wet etch or Chemical Mechanical Polishing (CMP). The height of the protruding other ends of the first through electrodes 120, the second through electrodes 122 and the third through electrodes may be several micrometers.

Figure 3B:
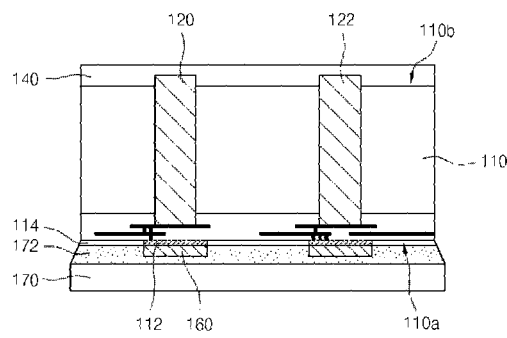
Figure 3C:
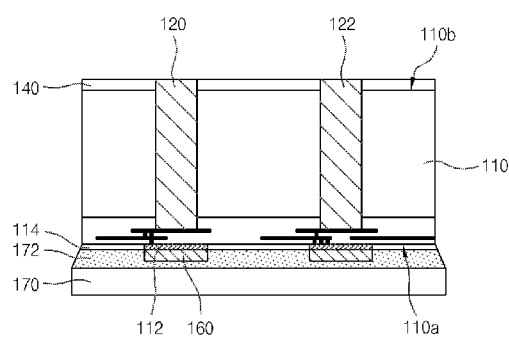

Referring to FIG. 3B, the insulating layer 140 is formed over the second surface 110b of the semiconductor chip body 110 such that the first through electrodes 120, the second through electrodes 122 and the third through electrodes are covered by the insulating layer 140. The insulating layer 140 may be formed of any one selected from a silicon oxide film, a silicon nitride film, a photosensitive film and a polymer film.

Referring to FIG. 3, the insulating layer 140 is polished using a CMP process such that the other ends of the first through electrodes 120, the second through electrodes 122 and the third through electrodes arranged over the second surface 110b of the semiconductor chip body 110 are exposed. As the result, the insulating layer 140 is formed over the second surface 110b of the semiconductor chip body 110 such that the insulating layer 140 does not cover the other ends of the first through electrodes 120, the second through electrodes 122 and the third through electrodes.

Alternatively, though not shown, the recess process on the second surface 110b of the semiconductor chip body 110 is omitted such that the other ends of the first through electrodes 120, the second through electrodes 122 and the third through electrodes do not protrude from the second surface 110b of the semiconductor chip body 110. If the recess process is omitted, after the insulating layer 140 is formed, the insulating layer 140 may be etched such that the other ends of the first through electrodes 120, the second through electrodes 122 and the third through electrodes are exposed.

Figure 3D:
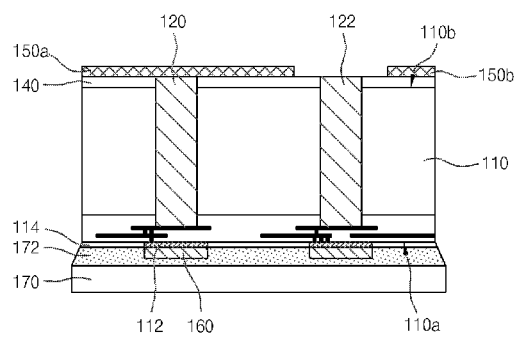

Referring to FIG. 3D, a thin heat spreading material layer is formed over the insulating layer 140 and the exposed other ends of the first through electrodes 120, the second through electrodes 122 and the third through electrodes, and then the heat spreading material layer may be patterned such that the heat spreading layers 150a and 150b are formed over the insulating layer 140, the first through electrodes 120 and the second through electrodes 122. The heat spreading layers 150a and 150b may include the first heat spreading layer 150a and second heat spreading layer 150b. The first heat spreading layer 150a may be formed to cover the first through electrodes 120 that are power electrodes or ground electrodes, and the second heat spreading layer 150b may be formed to cover the third through electrodes that are ground electrodes or power electrodes. The third through electrode may have a potential different from the first through electrodes 120.

In the present embodiment, the heat spreading layers 150a and 150b may be formed by applying and then patterning a material having a high thermal conductivity, e.g. graphene having a thermal conductivity of 500 to 5000 W/mK to a thickness of 0.3 to 6 μm over the other ends of the insulating layer 140 and the exposed other ends of the first through electrodes 120, the second through electrodes 122 and the third through electrodes. Alternatively, the heat spreading layers 150a and 150b may be formed by forming and then patterning a thin film made of at least one of copper (Cu), gold (Au), silver (Ag) and nickel (Ni), instead of graphene.

Furthermore, the first heat spreading layer 150a may be formed to be connected to all of the plurality of the first through electrodes 120. On the contrary, the first and second through electrodes 150a and 150b are formed such that the first and second through electrodes 150 and 150b are not connected to the second through electrodes, i.e. signal electrodes.

Figure 3E:
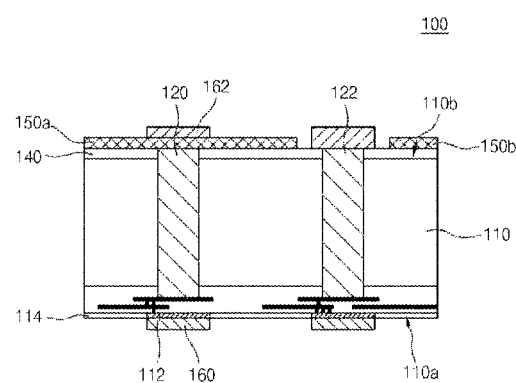

Referring to FIG. 3E, at least one second connection electrode 162 is formed over each of the portions of the heat spreading layer 150a above the other ends of the first through electrodes 120 and the third through electrodes and the other ends of the second through electrodes 122. The second connection electrodes 160 may be rear bumps and may be formed of any of solder, nickel, copper, tin and alloy thereof. The carrier substrate 170 is then removed from the semiconductor chip body 110, and thus fabrication of the semiconductor chip 100 in accordance with an embodiment is completed. The adhesive layer 172 may be subjected to heat or UV radiation as part of removing the carrier substrate 170.

Although the second connection electrodes 162 are formed prior to the removal of the carrier substrate 170, the second connection electrodes 162 may be formed after the removal of the carrier substrate 170.

A semiconductor chip in accordance with an embodiment of the present disclosure will be described with reference to FIGS. 4A and 4B. Here, duplicated description for the same parts as the previous embodiment will be omitted and the same reference numerals will be given to the same parts.

Figure 4A:
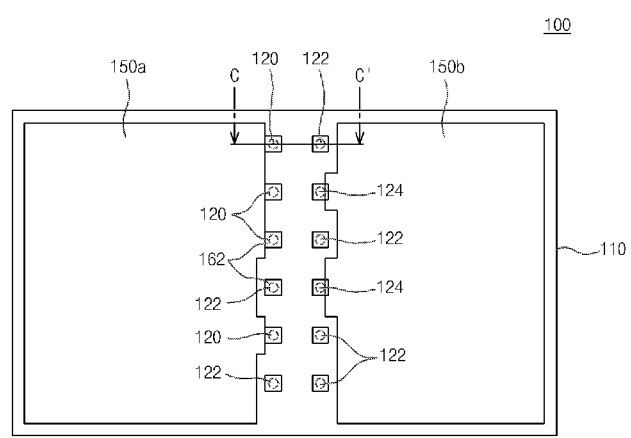
FIG. 4A is a plan view illustrating a semiconductor chip in accordance with an embodiment of the present disclosure.
Figure 4B:
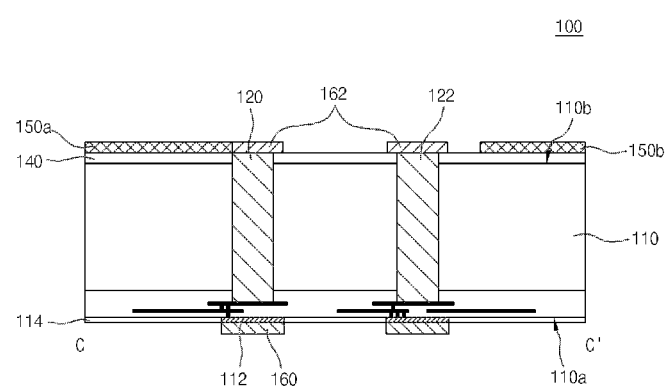
FIG. 4B is a cross-sectional view taken along a line C-C' of FIG. 4A.

Referring to FIGS. 4A and 4B, the first and second heat spreading layers 150a and 150b in the present embodiment may be formed adjoining to the other ends of the first and third through electrodes 120 and 124, unlike the previous embodiments in that the first and second heat spreading layers 150a and 150b are formed covering the other ends of the first and third through electrodes 120 and 124. Alternatively, the first and second heat spreading layers 150a and 150b may be formed adjoining to the second connection electrodes 162 formed over the other ends of the first and third through electrodes 120 and 124.

A semiconductor chip in accordance with an embodiment of the present invention will be described with reference to FIGS. 5A and 5B. Here, duplicated description for the same parts as the previous embodiments will be omitted and the same reference numerals will be given to the same parts.

Figure 5A:
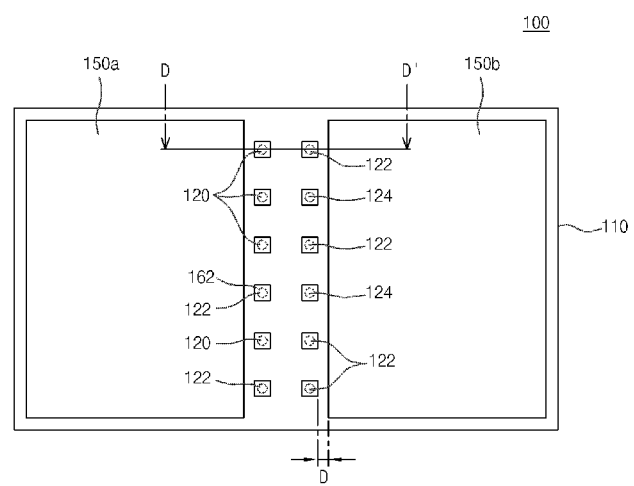
FIG. 5A is a plan view illustrating a semiconductor chip in accordance with an embodiment of the present disclosure.
Figure 5B:
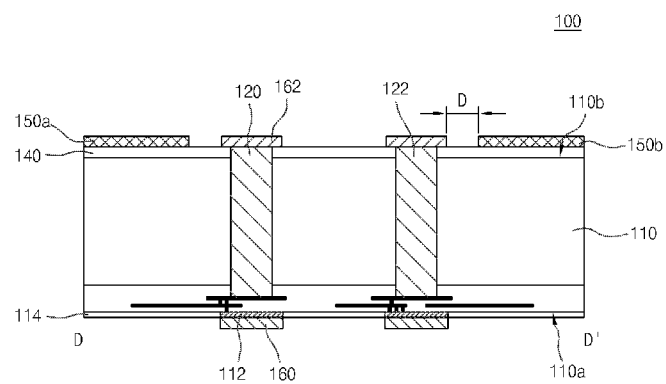
FIG. 5B is a cross-sectional view taken along a line D-D' of FIG. 5A.

Referring to FIGS. 5A and 5B, the semiconductor chip 100 in accordance with an embodiment of the present invention may include the semiconductor chip body 110, the plurality of the first through electrodes 120, the plurality of the second through electrodes 122, the plurality of the third through electrodes 124, the insulating layer 140, the heat spreading layers 150a and 150b, and the plurality of the first connection electrodes 160 and the plurality of the second connection electrodes 162.

The heat spreading layers 150a and 150b may be formed, as in the previous embodiments, of at least one of graphene, copper (Cu), gold (Au), silver (Ag) and nickel (Ni). However, unlike the previous embodiments, the heat spreading layers 150a and 150b in the present embodiment are formed as a thin film only over the insulating layer 140 such that the heat spreading layers 150a and 150b are not in direct contact with the first and third through electrodes 120 and 124.

In general, when two materials are placed at a predetermined distance, i.e. a distance shorter than the maximum distance allowing heat transfer between the two materials, heat may be transferred from the material having higher temperature to the material having lower temperature. Accordingly, the heat spreading layers 150a and 150b are arranged such that the ends of the heat spreading layers 150a and 150b—adjacent to the first, second and third through electrodes 120, 122 and 124—are placed a distance of or below 100 μm, preferably between 5 μm and 100 μm, from the first, second and third through electrodes 120, 122 and 124. As the result, the present embodiment also allows rapid spreading of the heat generated during operation of the semiconductor chip through the heat spreading layers 150a and 150b. Furthermore, the heat is transferred from the heat spreading layers 150a and 150b to the first or third through electrodes 120 or 124, i.e. power electrodes or ground electrodes, and thus can be efficiently discharged to the outside.

The plurality of the second connection electrodes 162 may be formed over the other ends of the first, second and third through electrodes 120, 122 and 124 arranged over the second surface 110b of the semiconductor chip body 110. Particularly, the second connection electrodes 162, in the present embodiment, are not formed over the heat spreading layers 150a and 150b, but cover only the other ends of the first, second and third through electrodes 120, 122 and 124.

As described above, the semiconductor chip in accordance with the present embodiment has, like the previous embodiments, a structure in that heat generated during its operation is effectively spread by the formation of the heat spreading layers. Furthermore, the semiconductor chip in accordance with the present embodiment can rapidly discharge heat to the outside since this embodiment includes a structure in that the heat spreading layers are spaced apart from the first and third through electrodes but are still able to transfer heat to the first and third through electrodes. Therefore, the semiconductor chip 100 in accordance with the present embodiment also can effectively prevent poor operation due to the heat generated during its operation.

Figure 6:
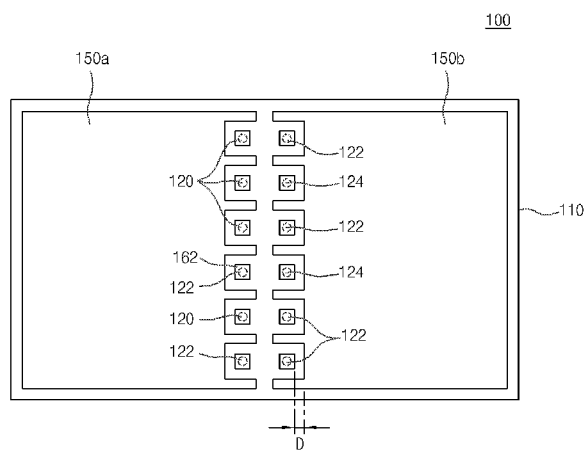
FIG. 6 is a plan view illustrating a semiconductor chip in accordance with an embodiment of the present disclosure.

A semiconductor chip in accordance with an embodiment of the present invention will be described with reference to FIG. 6. Here, duplicated description for the same parts as the previous embodiments will be omitted and the same reference numerals are given to the same parts.

In the semiconductor chip 100 in accordance with the present embodiment, the heat spreading layers 150a and 150b have a form in which ends of the heat spreading layers 150a and 150b surround the first, second and third through electrodes 120, 122 and 124 with a predetermined distance, e.g. a distance of below 100 μm, preferably between 5 μm and 100 μm, between the first, second and third through electrodes 120, 122 and 124. That is to say, the heat spreading layers 150a and 150b are formed such that ends of the heat spreading layers 150a and 150b surround the first, second and third through electrodes 120, 122 and 124 with a predetermined distance between the ends of the first, second and third through electrodes 120, 122, 124 and the heat spreading layers 150a, 150b.

Also in the present embodiment, the heat generated during operation of the semiconductor chip 100 is rapidly spread through the heat spreading layers 150a and 150b. Furthermore, the heat is transferred from the heat spreading layers 150a and 150b to the first or third through electrodes 120 or 124, i.e. power electrodes or ground electrodes, and thus can be efficiently discharged to the outside.

Figure 7:
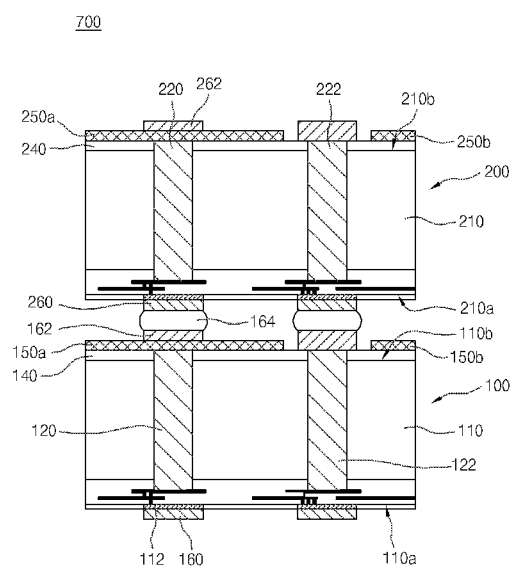
FIG. 7 is a cross-sectional view illustrating a stacked type package in accordance with an embodiment of the present disclosure.

Hereafter, a stacked type semiconductor package in accordance with an embodiment fabricated by stacking at least two aforementioned semiconductor chips in accordance with an embodiment will be described with reference to FIG. 7. Here, duplicated description for the same parts in the FIG. 2 will be omitted and the same reference numerals will be given to the same parts.

As shown, the stacked type semiconductor package 700 in accordance with an embodiment includes a first semiconductor chip 100 and at least one second semiconductor chip 200 stacked over the first semiconductor chip 100. In addition, the stacked type semiconductor package 700 in accordance with an embodiment may further include connection members 164 that electrically connect the first semiconductor chip 100 and the second semiconductor chip 200.

The first semiconductor chip 100 includes, as described above, the semiconductor chip body 110, the plurality of the first through electrodes 120, the plurality of the second through electrodes 122 and the plurality of the third through electrodes (see, for example, FIG. 6), the first, second and third through electrodes being formed inside the semiconductor chip body 110; the insulating layer 140 formed over the second surface 110b of the semiconductor chip body 110; the heat spreading layers 150a and 150b formed over the insulating layer 140 and the other ends of the first through electrodes 120 and the third through electrodes; and the plurality of the first and second connection electrodes 160 and 162 formed over respective one ends and the other ends of the first through electrodes 120, the second through electrodes 122 and the third through electrodes.

The second semiconductor chip 200 has a structure that is substantially the same as the first semiconductor chip 100. Specifically, the second semiconductor chip 200 may include a semiconductor chip body 210 having a first surface 210a and a second surface 210b which is opposite to the first surface 210a, a plurality of first through electrodes 220, a plurality of second through electrodes 222 and a plurality of third through electrodes (not shown), the first, second and third through electrodes being formed inside the semiconductor chip body 210; an insulating layer 240 formed over the second surface 210b of the semiconductor chip body 210; heat spreading layers 250a and 250b formed over the insulating layer 240 and the other ends of the first through electrodes 220 and the third through electrodes; and a plurality of first and second connection electrodes 260 and 262 formed over the respective one ends and the other ends of the first through electrodes 220, the second through electrodes 222 and the third through electrodes.

The connection member 164 may be interposed between the second connection electrodes 162 of the first semiconductor chip 100 and the first connection electrodes 260 of the second semiconductor chip 200. When at least two second semiconductor chips 200 are stacked over the first semiconductor chip 100, the connection member 164 may also be interposed between the second connection electrodes 262 of the lower second semiconductor chip 200 and the first connection electrodes 260 of the upper second semiconductor chip 200. The connection member 164 may be, for example, a solder having a low melting point or an anisotropic conductive film (ACF) including resin and fine conductive balls.

In the stacked type semiconductor package in accordance with an embodiment, each of the stacked first and second semiconductor chips includes heat spreading layers that are connected to the first and third through electrodes, i.e. power and ground electrodes, and the first and third through electrodes in each semiconductor chip are connected with each other. Accordingly, with the stacked type semiconductor package in accordance with an embodiment, heat generated during operation of the semiconductor chips can be effectively discharged through the heat spreading layers and the first through electrodes. Particularly, operation errors of the upper semiconductor chip due to transfer of heat generated in the lower semiconductor chip to the upper semiconductor chip can be effectively prevented.

A stacked type semiconductor package in accordance with an embodiment will be described with reference to FIG. 8. Here, duplicated description for the same parts as the embodiment shown in FIG. 7 will be omitted and the same reference numerals will be given to the same parts.

When compared to the previous embodiment, the stacked type semiconductor package 700 in accordance with the present embodiment may further include a passivation layer 270 formed over the second semiconductor chip 200. Furthermore, the stacked type semiconductor package 700 in accordance with the present embodiment may further include a heat spreader 280 attached onto the passivation layer 700. In addition, the stacked type semiconductor package 700 in accordance with the present embodiment may further include a thermal interface material (TIM) 272 interposed between the passivation layer 270 and the heat spreader 280.

The passivation layer 270 may be formed over the second surface 210b of the semiconductor chip body 210 of the second semiconductor chip 200, or the second surface 210b of the semiconductor chip body 210 of the uppermost second semiconductor chip 200 when at least two second semiconductor chips 200 are stacked, such that the passivation layer 270 covers the heat spreading layers 250a and 250b and the second connection electrodes 262. This passivation layer 270 may be formed, for example, of insulating resin.

The heat spreader 280 serves to dissipate heat generated during high speed operation of the semiconductor chips 100 and 200. The heat spreader 280 may be formed of a metal material having superior thermal conductivity and heat dissipating properties.

The TIM 272 may be formed, for example, of a hardener that is hardened by heat or light, an adhesive and a thermal conductive material. In an alternative embodiment, the TIM 272 may be omitted. If the TIM 272 is omitted, the heat spreader 280 may be directly attached onto the passivation layer 270 of the uppermost second semiconductor chip 200 without interposition of the TIM 272.

The stacked type semiconductor package in accordance with the present embodiment has improved heat dissipating properties as compared to the previous embodiment, due to the attachment of the heat spreader onto the uppermost second semiconductor chip.

A stacked type semiconductor package in accordance with an embodiment will be described with reference to FIG. 9. Here, duplicated description for the same parts as the embodiment shown in FIG. 7 will be omitted and the same reference numerals will be given to the same parts.

When compared to the previous embodiment, the stacked type semiconductor package 700 in accordance with the present embodiment may further include a third semiconductor chip 300 stacked over the uppermost second semiconductor chip 200. In addition, the stacked type semiconductor package 700 in accordance with the present embodiment may further include first further connection members 364 that electrically connect the second semiconductor chip 200 and the third semiconductor chip 300.

The third semiconductor chip 300 may include a semiconductor chip body 310 having a first surface 310a and a second surface 310b which is opposite to the first surface 310a. The third semiconductor chip 310 may include a circuit unit (not shown) formed in the inside thereof. Furthermore, the third semiconductor chip 300 may include a plurality of bonding pads 360 that are arranged over an active surface of the third semiconductor chip 300, i.e. the first surface 310a and electrically connected to respective second connection electrodes 262 of the second semiconductor chip 200. Here, each of the bonding pads 360 may be individually connected to the circuit unit formed inside the semiconductor chip body 310.

The first further connection members 364 may be interposed between the second connection electrodes 262 of the second semiconductor chip 200 and the bonding pads 360 of the third semiconductor chip 300. The first further connection members 364 may be, for example, a solder having a low melting point or an ACF including resin and fine conductive balls.

The stacked type semiconductor package in accordance with the present embodiment may employ as the third semiconductor chip a different type of a semiconductor chip from the first and second semiconductor chips. Accordingly, the semiconductor package in accordance with the present embodiment has an advantage in that a system on chip (SoC) may be configured employing memory chips as the first and second semiconductor chips and a logic chip as the third semiconductor chip.

A stacked type semiconductor package in accordance with an embodiment will be described with reference to FIG. 10. Here, duplicated description for the same parts as the embodiment shown in FIG. 9 will be omitted and the same reference numerals will be given to the same parts.

When compared to the previous embodiment, the stacked type semiconductor package 700 in accordance with the present embodiment may further include a TIM 370 formed over the third semiconductor chip 300 and a heat spreader 380 attached to the TIM 270. Accordingly, the stacked type semiconductor package 700 in accordance with the present embodiment has advantages in that the semiconductor package 700 may comprise a SoC having improved heat dissipating properties.

Figure 11:
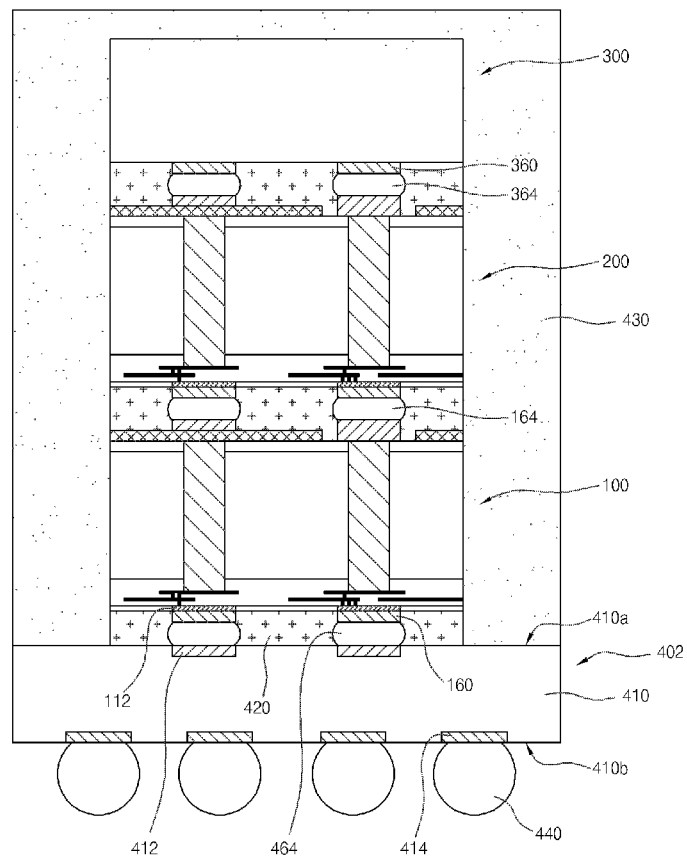
FIG. 11 is a cross-sectional view illustrating a stacked type package in accordance with an embodiment of the present disclosure.

A stacked type semiconductor package in accordance with an embodiment will be described with reference to FIG. 11. Here, duplicated description for the same parts as the embodiment shown in FIG. 9 will be omitted and the same reference numerals will be given to the same parts.

Figure 9:
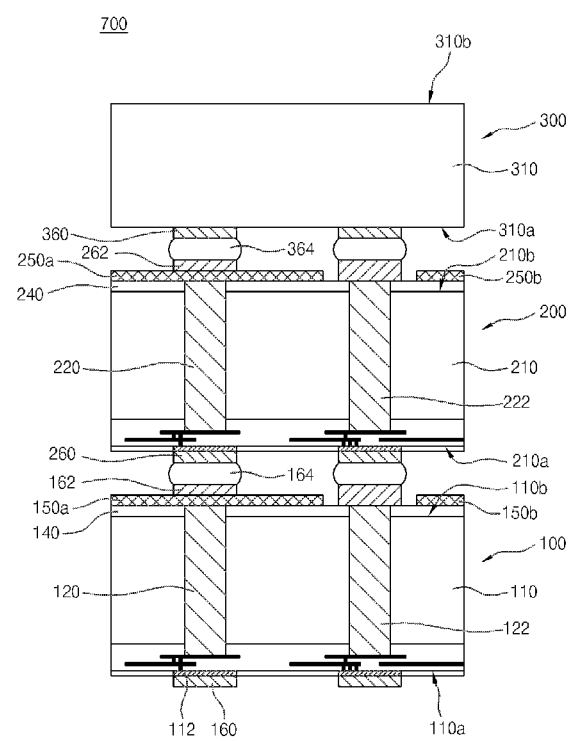
FIG. 9 is a cross-sectional view illustrating a stacked type package in accordance with an embodiment of the present disclosure.

When compared to the embodiment of FIG. 9, the stacked type semiconductor package 700 in accordance with the present embodiment may further include a structural body 401. In addition, the stacked type semiconductor package 700 in accordance with the present embodiment may further include second further connection members 464. Furthermore, the stacked type semiconductor package 700 in accordance with the present embodiment may further include underfill members 420, encapsulating member 430 and external mounting members 440.

The structural body 402 may be arranged below the first semiconductor chip 100. The structural body 402 may be any one of an interposer, an additional semiconductor chip, a semiconductor package or a printed circuit board. For example, the structural body 402 may be a printed circuit board including a substrate body 410 having an upper surface 410a and a lower surface 410b, bond fingers 412 arranged over the upper surface 410a of the substrate body 410, and ball lands 414 arranged over the lower surface 410b of the substrate body 410. Here, the bond fingers 412 and the ball lands 414 may be connected one-to-one to each other through via wiring (not shown) formed within the substrate body.

Electrical connection among the semiconductor chips 100, 200 and 300 may be established by the connection members 164, the first further connection members 364 and the second further connection members 464. Specifically, the connection members 164 electrically connect the first semiconductor chip 100 and the second semiconductor chip 200. The first further connection members 364 electrically connect the second semiconductor chip 200 and the third semiconductor chip 300. The second further connection members 464 electrically connect the first semiconductor chip 100 and the structural body 402. In particular, second further connection members 464 are interposed between the first connection electrodes 160 of the first semiconductor chip 100 and the bond fingers 412 of the structural body 402. Like the first further connection members 364, the second further connection members 464 may be, for example, a solder having a low melting point or an ACF including resin and fine conductive balls.

The underfill members 420 may be formed such that the underfill members 420 fill in spaces between the structural body 402 and the first semiconductor chip 100, fill in spaces between the first semiconductor chip 100 and the second semiconductor chip 200 and fill in spaces between the second semiconductor chip 200 and the third semiconductor chip 300. The encapsulating member 430 may be formed over the upper surface 410a of the structural body 402 such that the encapsulating member 430 covers the stacked first, second and third semiconductor chips 100, 200 and 300. The encapsulating member 430 may include an Epoxy Molding Compound (EMC). The external mounting members 440 may be attached onto the ball lands 414 of the structural body 402. The external mounting members 440 may be, for example, solder balls. The external mounting members 440 may have a shape of a pin, instead of the shape of a ball.

The stacked type semiconductor package 700 may further include a heat spreader attached to the encapsulating member 430.

Figure 8:
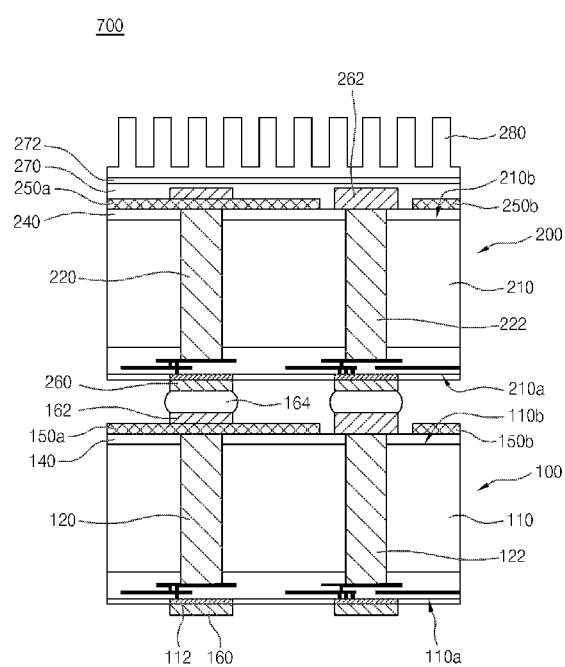
FIG. 8 is a cross-sectional view illustrating a stacked type package in accordance with an embodiment of the present disclosure.
Figure 10:
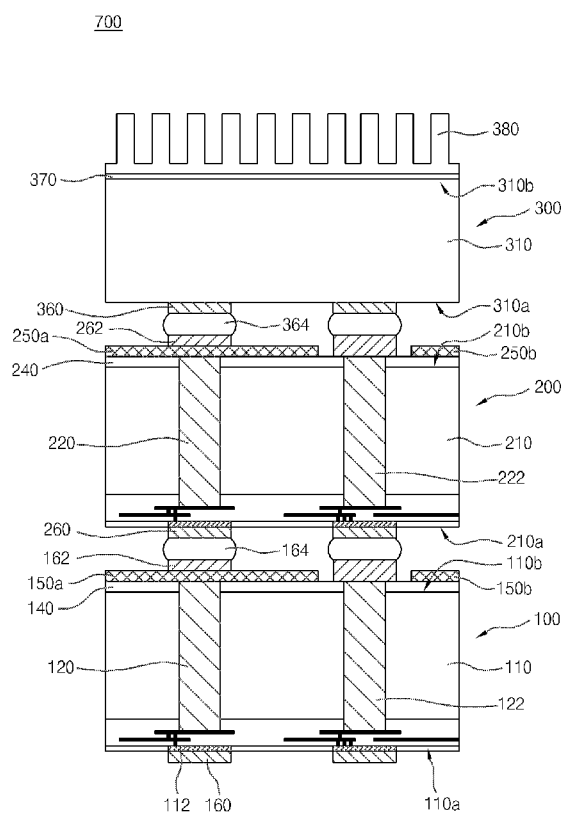
FIG. 10 is a cross-sectional view illustrating a stacked type package in accordance with an embodiment of the present disclosure.

Furthermore, though not shown and described, the stacked type semiconductor package may also be configured in the forms shown FIGS. 7 to 11 by stacking at least two of the semiconductor chips of the embodiments shown FIGS. 8 to 10.

The semiconductor chip in accordance with various embodiments may be applied to a variety of semiconductor devices and package modules having the same.

Figure 12:
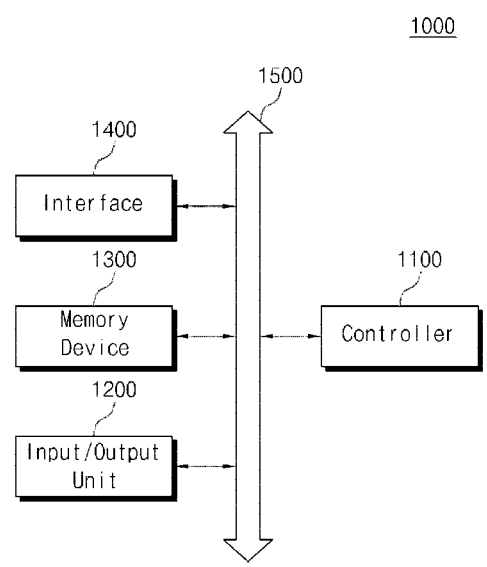
FIG. 12 is a block diagram showing an electronic system to which the semiconductor chip in accordance with various embodiments of the present disclosure may be applied.

Referring to FIG. 12, the semiconductor chip in accordance with various embodiments may be applied to an electronic system. The electronic system 1000 may include a controller 1100, an input/output unit 1200, and a memory device 1300. The controller 1100, the input/output unit 1200 and the memory 1300 may be coupled with one another through a bus 1500. The bus 1500 serves as a path through which data move.

For example, the controller 1100 may include at least any one of the following: one or more microprocessors, one or more digital signal processors, one or more microcontrollers, and logic devices capable of performing the same functions as these components. The input/output unit 1200 may include at least one selected among a keypad, a keyboard, a display device, and so forth.

The memory 1300 may include the stacked type semiconductor package according to various embodiments of the present invention. The memory device 1300 may store data and/or commands to be executed by the controller 1100 and the like. The memory device 1300 may include a volatile memory device and/or a nonvolatile memory device, such as a flash memory. For example, a flash memory to which the technology of the present invention is applied may be mounted to an information processing system such as a mobile terminal or a desktop computer. The flash memory may be constituted by a solid state drive (SSD). In this case, the electronic system 1000 may stably store a large amount of data in a flash memory system.

The electronic system 1000 may further include an interface 1400 configured to transmit and receive data to and from a communication network. The interface 1400 may be a wired or wireless type. For example, the interface 1400 may include an antenna or a wired (or wireless) transceiver. The interface 1400 may be coupled to the bus 1500.

Though not shown, the electronic system 1000 may further include an application chipset, a Camera Image Process (CIP), an input/output device and the like.

The electronic system 1000 may be realized as a mobile system, a personal computer, an industrial computer or a logic system performing various functions. For example, the mobile system may be any one of a personal digital assistant (PDA), a portable computer, a web tablet, a mobile phone, a smart phone, a wireless phone, a laptop computer, a memory card, a digital music system and an information transmission/reception system.

If the electronic system 1000 is equipment capable of performing wireless communication, the electronic system 1000 may be used in a communication system such as of CDMA (code division multiple access), GSM (global system for mobile communication), NADC (north American digital cellular), E-TDMA (enhanced-time division multiple access), WCDAM (wideband code division multiple access), CDMA2000, LTE (long term evolution) and Wibro (wireless broadband Internet).

Figure 13:
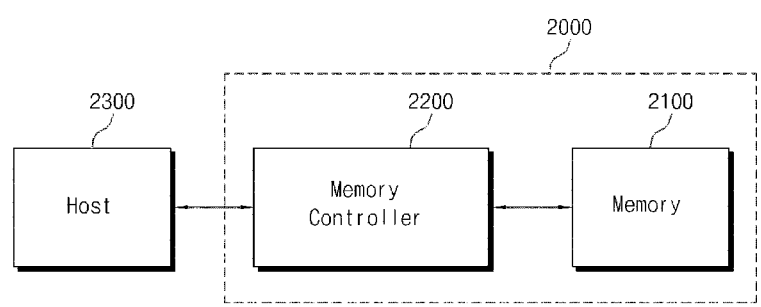
FIG. 13 is a block diagram illustrating an electronic apparatus which may include the semiconductor chip in accordance with various embodiments of the present disclosure.

Referring to FIG. 13, the semiconductor chip in accordance with various embodiments may be provided in the form of a memory card 2000. For example, the memory card 2000 may include a memory 2100 such as a nonvolatile memory device and a memory controller 2200. The memory 2100 and the memory controller 2200 may store data or read stored data.

The memory 2100 may include at least any one among nonvolatile memory devices to which the packaging technology of the embodiments of the present invention is applied. The memory controller 2200 may control the memory 2100 such that stored data is read out or data is stored in response to a read/write request from a host 2300.

While the present invention has been described with respect to the specific embodiments, it will be apparent to those skilled in the art that various changes and modifications may be made without departing from the spirit and scope of the invention as defined in the following claims.

What is claimed is:

1. A semiconductor chip, comprising:
    a semiconductor chip body having a first surface formed with a plurality of bonding pads and a second surface which is opposite to the first surface, the first surface being a bottom surface of the semiconductor chip body, and the second surface being a top surface of the semiconductor chip body;
    a plurality of first and second through electrodes passing through the semiconductor chip body such that bottom surfaces of the first and second through electrodes are electrically connected to the bonding pads;
    an insulating layer formed over the second surface of the semiconductor chip body such that top surfaces of the first and second through electrodes are not covered by the insulating layer; and
    a first heat spreading layer formed over a top surface of the insulating layer,
    wherein the top surface of the insulating layer is coplanar with the top surfaces of the first and second through electrodes.

2. The semiconductor chip of claim 1, wherein the first heat spreading layer comprises a thickness of 0.3 to 6 μm and a thermal conductivity of 500 to 5000 watts per meter kelvin (W/mK).

3. The semiconductor chip of claim 2, wherein the first heat spreading layer is formed of graphene.

4. The semiconductor chip of claim 1, wherein the first heat spreading layer is formed such that the first heat spreading layer is in direct contact with the first through electrodes but is not in contact with the second through electrodes.

5. The semiconductor chip of claim 4, wherein the first heat spreading layer is formed such that the first heat spreading layer covers the first through electrodes.

6. The semiconductor chip of claim 4, wherein the first through electrodes are power electrodes or ground electrodes, and the second through electrodes are signal electrodes.

7. The semiconductor chip of claim 4, further comprising:
    a plurality of third through electrodes formed within the semiconductor chip body, electrically connected to the bonding pads at one ends of the third through electrodes and having a potential different from the first through electrodes; and
    a second heat spreading layer formed over the insulating layer such that the second heat spreading layer is in direct contact with the third through electrodes.

8. The semiconductor chip of claim 1, wherein the first heat spreading layer is formed such that it is not in direct contact with the first and second through electrodes.

9. The semiconductor chip of claim 8, wherein the first heat spreading layer is formed such that the ends thereof, adjacent to the first and second through electrodes, are placed 5 μm to 100 μm from the first and second through electrodes.

10. The semiconductor chip of claim 1, further comprising:
    first connection electrodes formed over the respective bonding pads; and
    second connection electrodes formed over the respective other ends of the first and second through electrodes.

* * * * *